United States Patent
Norfidathul et al.

(10) Patent No.: US 8,120,055 B2
(45) Date of Patent: Feb. 21, 2012

(54) LIGHT SOURCE

(75) Inventors: Aizar Abdul Karim Norfidathul, Simpang Ampat (MY); Chiau Jin Lee, Bayan Lepas (MY); Keat Chuan Ng, Gelugor (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 229 days.

(21) Appl. No.: 12/426,768

(22) Filed: Apr. 20, 2009

(65) Prior Publication Data

US 2010/0264450 A1    Oct. 21, 2010

(51) Int. Cl.
*H01L 33/00* (2010.01)
(52) U.S. Cl. .............. 257/99; 257/13; 257/98; 257/666; 257/E33.056; 257/E33.065
(58) Field of Classification Search .............. 257/13, 257/98–99, 666
See application file for complete search history.

(56) References Cited

U.S. PATENT DOCUMENTS

| | | | | |
|---|---|---|---|---|
| 3,781,584 A * | 12/1973 | Kingsbury | ............ | 313/513 |
| 6,307,253 B1 * | 10/2001 | Yamamoto et al. | ............ | 257/666 |
| 7,385,227 B2 * | 6/2008 | Mok et al. | ............ | 257/98 |
| 7,524,087 B1 * | 4/2009 | Aizar et al. | ............ | 362/267 |
| 7,566,159 B2 * | 7/2009 | Oon et al. | ............ | 362/612 |
| 7,635,915 B2 * | 12/2009 | Xie et al. | ............ | 257/692 |
| 2005/0151149 A1 * | 7/2005 | Chia et al. | ............ | 257/99 |
| 2006/0003628 A1 * | 1/2006 | Long et al. | ............ | 439/541.5 |
| 2006/0108669 A1 * | 5/2006 | Matsumoto et al. | ............ | 257/666 |
| 2006/0226435 A1 * | 10/2006 | Mok et al. | ............ | 257/98 |
| 2007/0252250 A1 * | 11/2007 | Hui et al. | ............ | 257/672 |
| 2008/0037278 A1 * | 2/2008 | Chang et al. | ............ | 362/611 |
| 2008/0048201 A1 | 2/2008 | Kim | | |
| 2008/0067535 A1 | 3/2008 | Wu | | |
| 2008/0153190 A1 * | 6/2008 | Ng et al. | ............ | 438/26 |
| 2009/0266584 A1 * | 10/2009 | Tsumura et al. | ............ | 174/252 |
| 2010/0032189 A1 * | 2/2010 | Muto et al. | ............ | 174/252 |
| 2010/0163918 A1 * | 7/2010 | Kim et al. | ............ | 257/99 |
| 2010/0264437 A1 * | 10/2010 | Loo et al. | ............ | 257/98 |
| 2011/0031526 A1 * | 2/2011 | Han et al. | ............ | 257/99 |
| 2011/0210366 A1 * | 9/2011 | Seo et al. | ............ | 257/98 |

FOREIGN PATENT DOCUMENTS

| | | |
|---|---|---|
| EP | 1814163 A | 7/2006 |
| WO | WO 2006-083110 A1 | 8/2006 |
| WO | WO 2008/002068 A1 | 1/2008 |

* cited by examiner

*Primary Examiner* — A. Sefer

(57) ABSTRACT

Embodiments of a light source are disclosed herein. An embodiment of the light source comprises a first terminal and a second terminal. The first terminal comprises a first terminal first portion and a first terminal second portion, wherein at least a portion of the first terminal second portion is located on a first plane, the first terminal second portion comprising at least two contacts separated by a space. A second terminal comprises a second terminal first portion and a second terminal second portion. The second terminal first portion is located proximate the first terminal first portion. The second terminal second portion is located substantially on the first plane and in the space. A light emitter is affixed to the first terminal first portion, the light emitter is electrically connected to the first terminal first portion. A connection exists between the light emitter and the second terminal first portion.

18 Claims, 4 Drawing Sheets

LIGHT SOURCE

BACKGROUND

Many sources use heat generating light emitting devices to generate light. The generation of high intensity light typically generates a great amount of heat, which must be removed from the light source in order to prevent the light source from becoming damaged. When light emitting diodes are used as the light emitting devices, the heat will degrade the light emitting devices.

DETAILED DESCRIPTION

Several embodiments of light sources are described herein. The light sources emit high intensity light, which generates a lot of heat. The heat degrades the components of the light source. The leads or terminals of the light sources are made to conduct the heat from the light generating elements, which serves to increase the operational life and light quality of the light sources.

Figure 1:
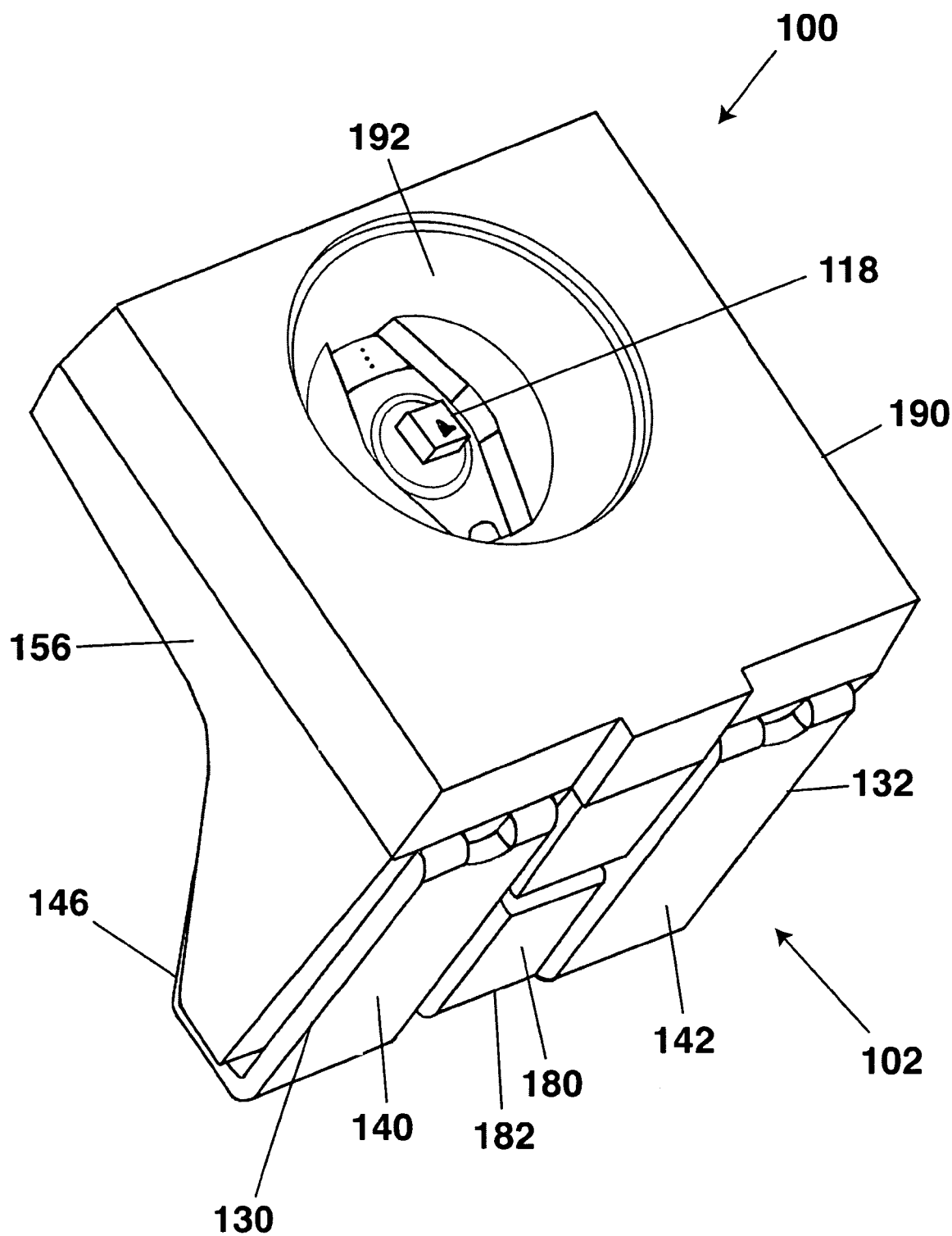
FIG. 1 is an perspective view of an embodiment of a light source.

An embodiment of a light source 100 is shown in FIG. 1, which is a perspective view of an embodiment of a light source 100. As described in greater detail below, the light source 100 includes a lower surface 102, wherein the lower surface or components thereon attach and/or connect to a substrate or circuit board (not shown).

Figure 2:
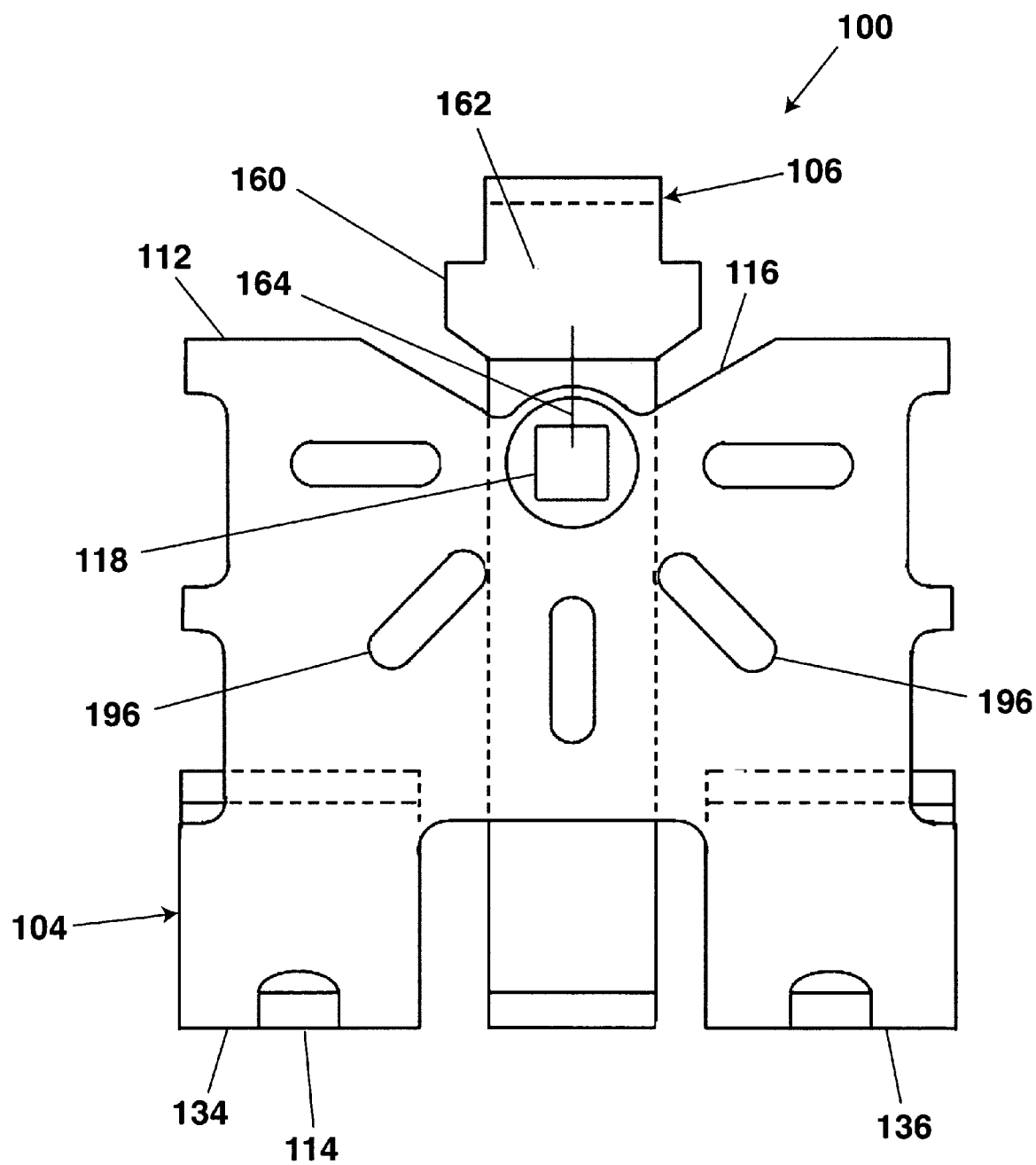
FIG. 2 is a front elevation view of an embodiment of the internal configuration of the light source of FIG. 1.
Figure 3:
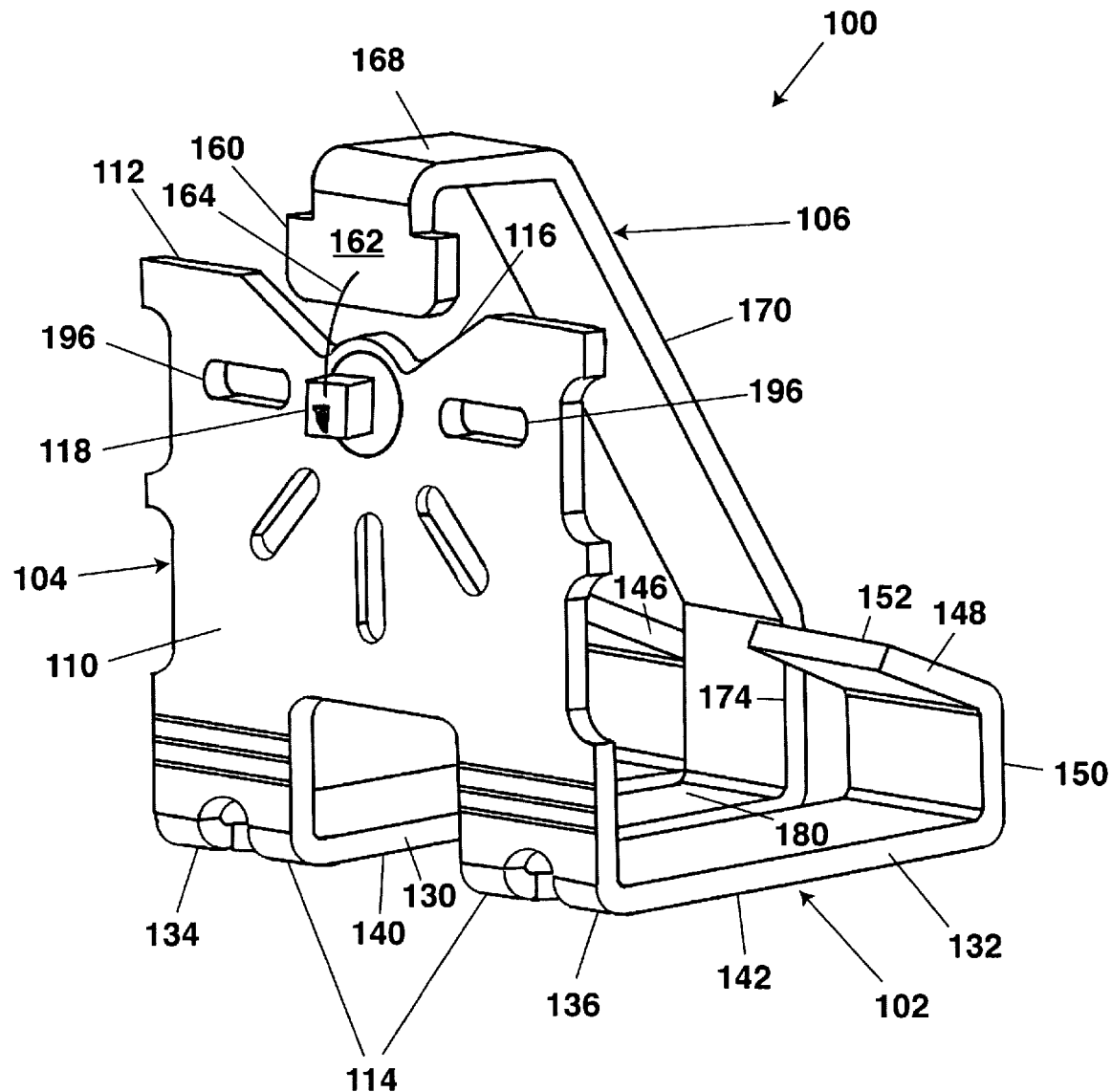
FIG. 3 is an isometric view of an embodiment of the internal configuration of the light source of FIG. 1.

A front elevation view of some of the internal components of the light source 100 is shown in FIG. 2. An isometric view of the light source 100 of FIG. 2 is shown in FIG. 3. The light source 100 has a first terminal 104 and a second terminal 106, which are shown individually in FIGS. 4 and 5. The terminals 104, 106 are made of several portions that may each be planar. The terminals 104, 106 may be made of conventional electrical conducting materials used in light sources, such as metal materials. The materials used in the conductors 104, 106 may also be thermal conductors in that they are capable of transferring heat from a light emitter as described in greater detail below.

Figure 4:
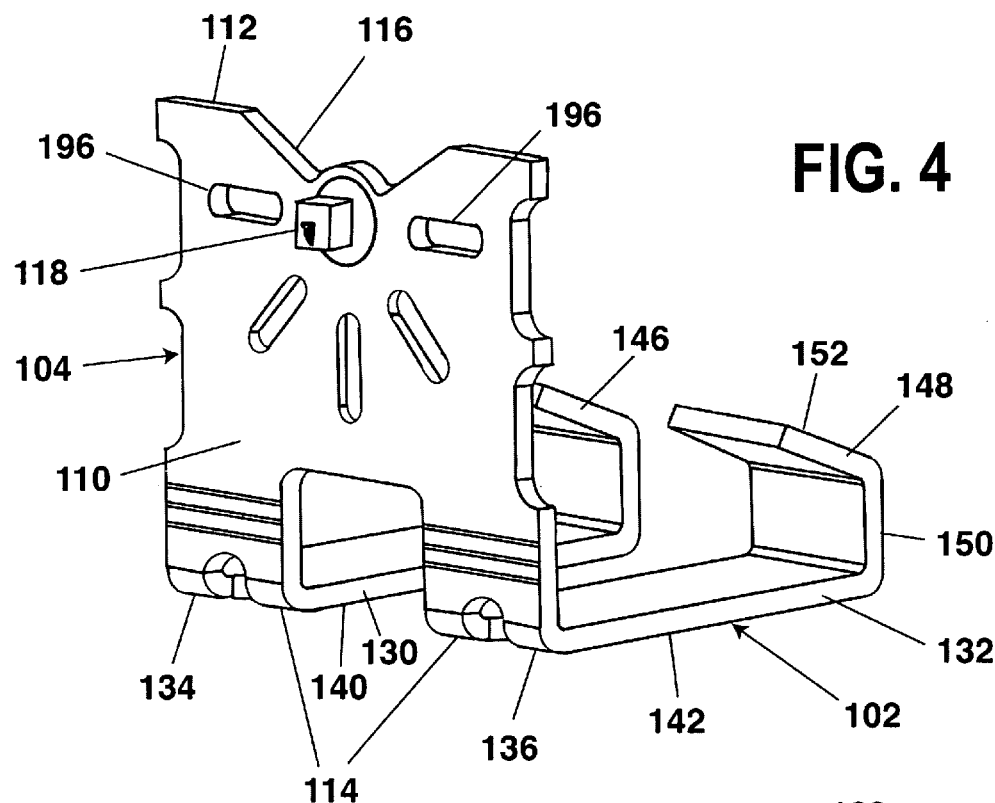
FIG. 4 is an isometric view of the first terminal of FIG. 2.

With additional reference to FIG. 4, the first terminal 104 has a first side or first portion 110. The first side 110 may be substantially planar as shown. In some embodiments, at least a portion of the first side 110 is parallel to a first plane, not shown. For reference purposes, the first side 110 has a first end 112 and a second end 114. In the embodiment of FIG. 1, the first end 112 has a notch 116 formed therein. As described in greater detail below, the first side 110 is adapted to hold a light emitter 118, which may be a high intensity light emitting diode (LED).

The second end 114 of the first terminal 104 has at least one contact connected thereto. These contacts may be referred to as a second portion or second portions of the first terminal 114. In the embodiment shown in FIGS. 3, 4, and 5, the first terminal 104 has two contacts connected thereto, which are referred to individually as the first contact 130 and the second contact 132. The contacts 130, 132 have a space therebetween, which may be sized to receive the second terminal 106 as described in greater detail below. The contacts 130, 132 serve to electrically and/or mechanically connect the light source 100 to a substrate or circuit board. In addition, the contacts 130, 132 serve to conduct heat from the light source 100 to the substrate or circuit board.

In some embodiments, the contacts 130, 132 are formed by bending the first terminal 104 at a first bend 134 and a second bend 136. Therefore, the first terminal 104 may be manufactured by bending a flat piece of metal or the like at the first bend 134 and the second bend 136.

The first contact 130 has a substantially planar surface 140. Likewise, the second contact 132 has a substantially planar surface 142. The planar surfaces 140, 142 may be parallel to a second plane that intersects the first plane. It is noted that the surfaces 140, 142 are used to secure the light source to a substrate or circuit board. Therefore, the surfaces 140, 142 may be configured to contact a substrate or circuit board. The surfaces 140, 142 may be configured to be soldered to a circuit board.

The first contact 130 may have a first hook 146 attached thereto or formed with the first contact. Likewise, the second contact 132 may have a second hook 148 attached thereto or formed therewith. The hooks 146, 148 may serve to secure materials in the light source 100. The hooks 146, 148 may also serve as additional heat sinks in order to increase the heat sinking capability of the first terminal 104. Reference is made to the second hook 148, which is substantially similar to the first hook 146. The embodiment of the second hook 148 described herein includes a first portion 150 that is connected to the second connector 132. The first portion 150 may be on a third plane, which is substantially parallel to the first plane. A second portion 152 is connected to the first portion and extends toward the first surface 110. The components of the first terminal 104 described above, may be formed by bending a flat piece of metal to the configuration described herein.

Thus, the second hook 148, in conjunction with the first hook 146 serves to secure a material 156 (FIG. 1) within the light source 100. The material 156 serves to maintain the first terminal 104 and the second terminal 106 in a fixed position relative to each other. In some embodiments, the material used for the first terminal 104 is flexible, which enables the terminals 104, 106 to flex and receive the material 156.

Figure 5:
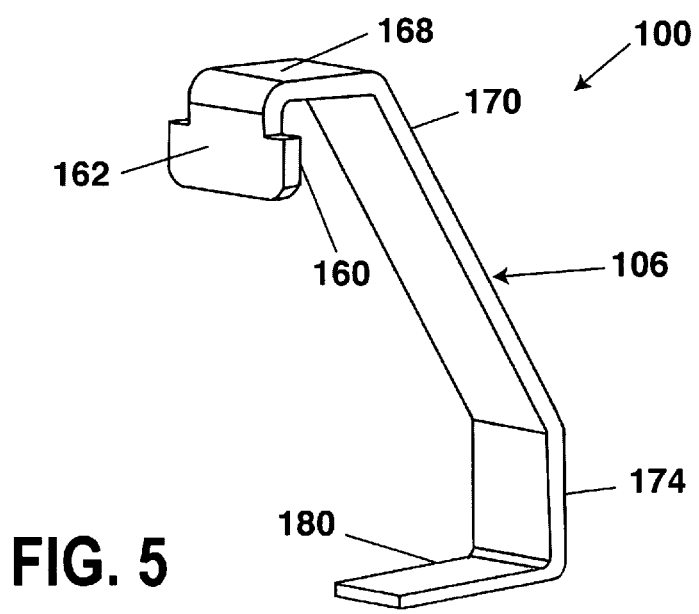
FIG. 5 is an isometric view of the second terminal of FIG. 3.

Having described the first terminal 104, the second terminal 106 will now be described with reference to FIGS. 2, 3, and 5. The second terminal has a first portion or tab 160. The tab 160 has a surface 162 on to which a wire 164 can be bonded. The tab 160 may be located or partially located in the notch 116. In some embodiments, the surface 162 is on the first plane or substantially parallel to the first plane. It is noted that the first terminal 104 does not contact the second terminal 106 except for the wire 164 as described below.

The second terminal 106 may have a second portion 168 that extends from the tab 160. The second portion 168 may be substantially parallel to the second plane. The second portion 168 enables the material 156 to fit within the light source 100. In some embodiments, the second portion 168 is not required. The second terminal 106 has a third portion 170 that extends between the second portion in a location proximate the first portion 150 of the hooks 146, 148. A fourth portion 174 may extend from the third portion 170 and may be on the third plane or parallel thereto. The fourth portion 174 may extend to the second plane so as to meet the lower surface 102.

The second terminal has a fifth portion 180 that is on or substantially parallel to the second plane. The fifth portion 180 has a surface 182, FIG. 1, which electrically connects to a circuit, such as a circuit board. The surface 182 may also be used to physically connect the light source 100 to a substrate or circuit board. In some embodiments, a tab extends from the fifth portion 180 and into the material 156 in order to secure the second terminal to the material 156.

A light emitter 118 is affixed to the surface 110. In some embodiments, the light emitter 118 has a contact facing the surface 110. Thus, when the light source 118 is affixed to the surface 110 an electrical connection is made between the light source 118 and the first terminal 104. The wire 164 connects a second contact of the light source 118 to the second terminal 106. It can be seen that a circuit is created from the first terminal 104, through the light source 118, through the wire 164, and to the second terminal 106.

Referring to FIG. 1, the material 156 serves to keep the terminals 104, 106 in a fixed location. In some embodiments, the material 156 may also serve to conduct heat from the light source 118. The material 156 may be thicker in the proximity of the lower surface 102, which moves the center of gravity of the light source 100 toward the surface 102. This location of the center of gravity enables the light source to sit on the surface 102 with a reduced probability of the light source tipping.

A cover 190 may be affixed to or located adjacent the surface 110. The cover 190 serves to prevent damage to the internal components of the light source 100. In addition, the cover may serve to sink heat from the surface 110. The cover 190 has a hole 192 located therein, which allows light emitted by the light emitter 118 to be emitted by the light source 100. The hole may be covered by a lens and may be filled with an encapsulant.

In some embodiments, the first terminal 104 has at least one hole 196 located therein. The holes 196 serve to anchor the cover 190 and possibly other components to the light source 100. The cover 190 may have tabs (not shown) that extend through the holes 196. In other embodiments, adhesives may be put in the holes 196 to secure the cover 190.

In operation, the light source is connected to a circuit. In this example, the light source is connected to a circuit board, not shown. The surfaces 140, 142 are electrically connected together and may be connected to a pad or the like of a circuit board. It is noted that either the first surface 140 or the second surface 142 needs to be electrically connected to a circuit. The other surface may be physically connected to the circuit board in order to conduct heat from the light source 100. The surface 180 of the second terminal 106 is electrically connected to another pad or the like.

During operation, the light emitter 118 generates heat. Because the second terminal 106 comes over the first terminal 104 via the tab 160, the first terminal 104, and in particular the surface 110, is much larger than those in conventional light sources. The larger size enables the first terminal 104 to conduct more heat from the light emitter 118 than would be possible with conventional light sources. The two surfaces 140, 142 increase the transfer of heat from the first terminal 104 to the circuit board over conventional light sources. Therefore, the light emitter 118 can emit higher intensity of light because the additional heat generated will be conducted away by the first terminal 104.

What is claimed is:
1. A light source comprising:
    a first terminal comprising:
        a first terminal first portion parallel to a first plane;
        a first terminal second portion, wherein at least some of the first terminal second portion is located on a second plane, the first terminal second portion comprising at least two contacts separated by a space, at least one of the two contacts configured for connection to a circuit;
    a second terminal positioned in the space and comprising:
        a second terminal first portion located proximate the first terminal first portion;
        a second terminal second portion, wherein at least some of the second terminal second portion is substantially parallel to the second plane, the second terminal second portion being configured for connection to a circuit;
    a light emitter affixed to a surface of the first terminal first portion, the light emitter being electrically connected to the first terminal first portion;
    a connection between the light emitter and the second terminal first portion; and
    wherein the first terminal second portion is connected to the first terminal first portion by at least one bend that bends away from the surface of the first terminal first portion on which the light emitter is affixed.

2. The light source of claim 1, wherein the first terminal first portion is substantially planar.

3. The light source of claim 2, wherein the second terminal first portion is substantially planar and wherein at least some of the second terminal first portion is located on a common plane with the first terminal first portion and wherein the common plane comprises the first plane.

4. The light source of claim 1, wherein the first terminal first portion has a notch and wherein at least some of the second terminal first portion is receivable in the notch.

5. The light source of claim 1 and further comprising a first terminal hook connected to the first terminal second portion, the first terminal hook extending toward the first terminal first portion.

6. The light source of claim 1, wherein the second terminal comprises a second terminal third portion connected to the second terminal second portion, and wherein the second terminal third portion extends from the second terminal second portion toward the first terminal second portion.

7. The light source of claim 6, wherein the second terminal comprises a fourth portion connected to the third portion and a fifth portion connected to the fourth portion, wherein each of the first, second, third, fourth, and fifth portions are on different planes.

8. The light source of claim 7, wherein the fifth portion is located on the second plane within the space.

9. The light source of claim 1, wherein the first plane intersects the second plane.

10. The light source of claim 1 and further comprising a material, the material contacting the first terminal and the second terminal, the material maintaining the first terminal in a fixed location relative to the second terminal.

11. The light source of claim 10, wherein the material is thicker proximate the first terminal second portion than proximate the second terminal first portion.

12. The light source of claim 1, wherein the light emitter is a light-emitting diode.

13. The light source of claim 1 and further comprising a cover located adjacent the first terminal first portion, the cover comprising a hole located proximate the light emitter wherein a light path extends from the light source through the hole.

14. The light source of claim 1, wherein the first terminal first portion comprises at least one hole.

15. The light source of claim 1, wherein the first plane is substantially orthogonal to the second plane.

16. The light source of claim 1, wherein the at least one bend comprises a first bend and a second bend that are separated by the space.

17. The light source of claim 1, wherein the space partially extends into the first terminal first portion.

18. The light source of claim 1, wherein the first terminal comprises a flat piece of metal that is bent at the at least one bend.

* * * * *